US010184173B1

(12) United States Patent
Yonemoto et al.

(10) Patent No.: US 10,184,173 B1
(45) Date of Patent: Jan. 22, 2019

(54) PLASMA PROCESSING METHOD

(71) Applicant: HITACHI HIGH-TECHNOLOGIES CORPORATION, Minato-ku, Tokyo (JP)

(72) Inventors: Takahiro Yonemoto, Tokyo (JP); Masahiro Sumiya, Tokyo (JP); Yoshito Kamaji, Tokyo (JP); Junya Sasaki, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 15/899,588

(22) Filed: Feb. 20, 2018

(30) Foreign Application Priority Data

Sep. 15, 2017 (JP) .................................. 2017-177958

(51) Int. Cl.
C23C 16/24 (2006.01)
C23C 16/44 (2006.01)
C23C 16/50 (2006.01)
C23C 16/448 (2006.01)
C23C 16/455 (2006.01)

(52) U.S. Cl.
CPC .......... *C23C 16/24* (2013.01); *C23C 16/4404* (2013.01); *C23C 16/4405* (2013.01); *C23C 16/4485* (2013.01); *C23C 16/45557* (2013.01); *C23C 16/50* (2013.01)

(58) Field of Classification Search
None
See application file for complete search history.

(56) References Cited

U.S. PATENT DOCUMENTS

| 7,204,913 | B1* | 4/2007 | Singh .................. C23C 16/4404 118/724 |
| 7,767,584 | B1 | 8/2010 | Singh et al. |
| 8,366,953 | B2 | 2/2013 | Kohno et al. |
| 8,557,709 | B2* | 10/2013 | Sumiya ............. H01J 37/32192 438/719 |
| 9,496,147 | B2 | 11/2016 | Sumiya et al. |
| 9,960,031 | B2 | 5/2018 | Sumiya et al. |
| 2011/0226734 | A1* | 9/2011 | Sumiya ............. H01J 37/32192 216/41 |
| 2014/0053983 | A1 | 2/2014 | Sumiya et al. |
| 2018/0082825 | A1* | 3/2018 | Watanabe ............. B08B 7/0035 |

FOREIGN PATENT DOCUMENTS

| JP | 2016-72264 A | 5/2016 |
| TW | 200830375 A | 7/2008 |
| TW | 201432813 A | 8/2014 |

OTHER PUBLICATIONS

Office Action dated Jun. 4, 2018 for Taiwanese Application No. 107103041.

* cited by examiner

*Primary Examiner* — Duy Vu N Deo
(74) *Attorney, Agent, or Firm* — Miles & Stockbridge P.C.

(57) ABSTRACT

A plasma processing method includes forming a deposition film containing silicon as a component in a processing chamber by generating a first plasma in the processing chamber; plasma etching of a sample in which a film containing a metal is formed in the processing chamber; and removing of a metal-based reaction product by generating a second plasma including an element having reducibility and halogen. The plasma processing method further includes removing the deposition film by a third plasma generated by using gas containing a fluorine element; and removing residual gas by a fourth plasma.

8 Claims, 6 Drawing Sheets

PLASMA PROCESSING METHOD

BACKGROUND OF THE INVENTION

Field of the Invention

The present invention relates to a plasma processing method such as cleaning using plasma.

Background Art

In recent years, a device structure has been complicated with miniaturization of a large-scale integrated circuit and demands for machining accuracy and stability in an etching step are getting stricter. A factor of process fluctuation in the etching step includes a temperature change of a member in a chamber or the like, accumulation of a reaction product generated by etching processing, or the like.

In addition, in a Metal Oxide Semiconductor Field Effect Transistor (MOSFET), a metal gate/High-k structure using a metal material for a gate electrode and a High-k material (hafnium oxide film or the like) for a gate insulating film becomes a mainstream with the miniaturization thereof. Due to the appearance of the metal gate/High-k structure, various types of metal etching are required. Accumulation of a metal-based reaction product generated by the metal etching causes process fluctuation and lowering of a maintenance cycle.

Moreover, as a technique for keeping a chamber atmosphere constant, JP-A-2016-72264 and U.S. Pat. No. 7,767,584 are known. In these techniques, a film composed of silicon, oxygen, carbon, or the like is formed on an inner wall of the chamber and is removed after product wafer processing, thereby resetting a state of the inner wall of the chamber for each product wafer processing. In addition to these techniques, a technique for cleaning a metal-based reaction product is disclosed in JP-A-2016-72264.

SUMMARY OF THE INVENTION

In JP-A-2016-72264, cleaning of the metal-based reaction product generated by etching is taken into consideration, but consideration of residual gas due to plasma cleaning is not made. It is a problem that process fluctuation (fluctuation in the chamber atmosphere) occurs in etching due to deposition of a residue (residual gas) caused by the plasma cleaning in the chamber.

An object of the invention is to provide a technique capable of suppressing process fluctuation in plasma etching.

The object and novel features of the invention will be apparent from the description of the present specification and the accompanying drawings.

An outline of representative embodiments among embodiments disclosed in the present application will be briefly described as follows.

According to an aspect of the invention, there is provided a plasma processing method including forming a deposition film containing silicon as a component in a processing chamber by using plasma generated in a processing chamber in which plasma processing is performed on a sample having a film containing a metal; and plasma processing the sample after the forming of the deposition film. Furthermore, the plasma processing method includes removing a deposit containing a metal element in the processing chamber by using plasma after the plasma processing; removing the deposition film in the processing chamber by plasma generated by using gas containing a fluorine element after the removing of the deposit containing a metal element; and removing the fluorine element remaining in the processing chamber by using plasma after the removing of the deposition film.

Effects obtained by representative embodiments among the inventions disclosed in the present application will be briefly described as follows.

It is possible to remove a residue caused by plasma cleaning, stabilize an atmosphere in the chamber, and suppress process fluctuation in plasma etching.

DETAILED DESCRIPTION OF THE INVENTION

Embodiment 1

Figure 1:
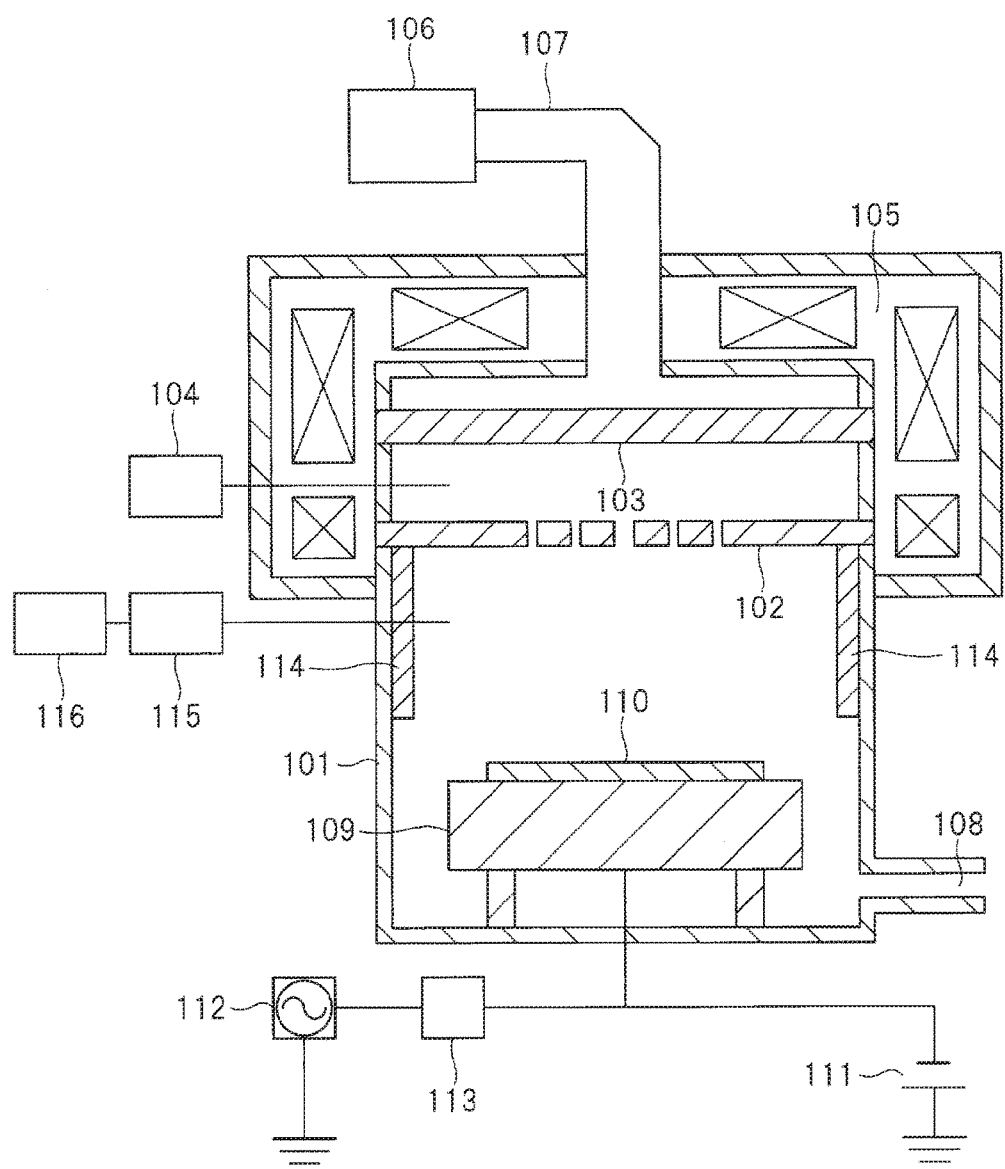
FIG. 1 is a sectional view illustrating an example of a schematic structure of a plasma processing apparatus according to Embodiment 1 of the invention.

FIG. 1 is a sectional view illustrating an example of a schematic structure of a plasma processing apparatus according to Embodiment 1 of the invention.

Hereinafter, the plasma processing apparatus of Embodiment 1 will be described. The plasma processing apparatus illustrated in FIG. 1 is a microwave Electron Cyclotron Resonance (ECR) plasma etching apparatus which is an example thereof. Here, an electrode that is provided inside a processing chamber 101, an electric field that is provided outside a chamber, a supply device of a magnetic field, power supply, or the like are schematic illustrated.

A configuration of the plasma processing apparatus of Embodiment 1 illustrated in FIG. 1 will be described. The plasma processing apparatus includes the processing chamber 101 which includes a chamber in which plasma etching processing is performed with respect to a sample 110 such as a semiconductor substrate and of which an upper portion is opened. A disk-shaped shower plate 102 having a plurality of through-holes for introducing etching gas and a dielectric window 103 are provided in the opened upper portion of the processing chamber 101. That is, the etching gas is introduced through the plurality of the through-holes of the shower plate 102 when plasma etching is executed.

In addition, the dielectric window 103 is provided in the upper portion of the processing chamber 101 and the inside of the chamber hermetically sealed by the dielectric window 103. Moreover, a flow rate of the gas introduced into the processing chamber 101 is controlled by a gas supply device 104 and the gas is introduced via the plurality of the through-holes of the shower plate 102.

In addition, the magnetic field is formed in the processing chamber 101 by solenoid coils 105 provided in an outer periphery and the upper portion of the processing chamber 101. An electromagnetic wave generating device 106 is provided in the upper portion of the plasma processing apparatus, an electromagnetic wave generated by the electromagnetic wave generating device 106 propagates through a waveguide pipe 107, passes through the dielectric window 103, and is supplied to the processing chamber 101. Furthermore, a vacuum evacuation pump (not illustrated) is connected to the lowest portion of the processing chamber 101 via a vacuum evacuation pipe 108. Therefore, the gas introduced into the processing chamber 101 and a reaction product generated by the etching processing can be exhausted through the vacuum evacuation pipe 108.

In addition, the shower plate 102 is provided in the upper portion of the processing chamber 101 and a sample table 109 is provided inside the processing chamber 101 to face the shower plate 102. The sample table 109 is also a substrate electrode provided in the lowest portion of the processing chamber 101. The sample 110 to be subjected to product processing is transported on the sample table 109 by a transport device (not illustrated) such as a robot arm. Moreover, the sample 110 that is placed on the sample table 109 is electrostatically attracted by the sample table 109 by applying a DC power supply 111. In this case, a radio frequency power supply 112 can apply a radio frequency voltage to the sample table 109 via a radio frequency matching device 113. Here, the sample 110 used in the embodiment is, for example, a semiconductor substrate on which a film containing a metal is formed.

In addition, a part of an inner wall of the processing chamber 101 is covered with an inner cylinder 114 made of quartz. Furthermore, a light emission spectroscope 115 is mounted on a side surface portion of the processing chamber 101 and light emission data is processed by a light emission data processing device 116.

In the plasma processing apparatus (etching apparatus), etching is executed in the following order. First, gas is supplied from the gas supply device 104 into the processing chamber 101 and the inside of the processing chamber 101 is controlled to a desired pressure. Next, the supplied gas is excited by electron cyclotron resonance by the electromagnetic wave generated from the electromagnetic wave generating device 106 and the magnetic field formed by the solenoid coil 105, and plasma is generated inside the processing chamber 101. Furthermore, the radio frequency voltage is applied by the radio frequency power supply 112, plasma ions are drawn into the sample 110 which is placed on the sample table 109 that is the substrate electrode and on which the film containing a metal is formed, and the plasma etching processing is executed.

Figure 2:
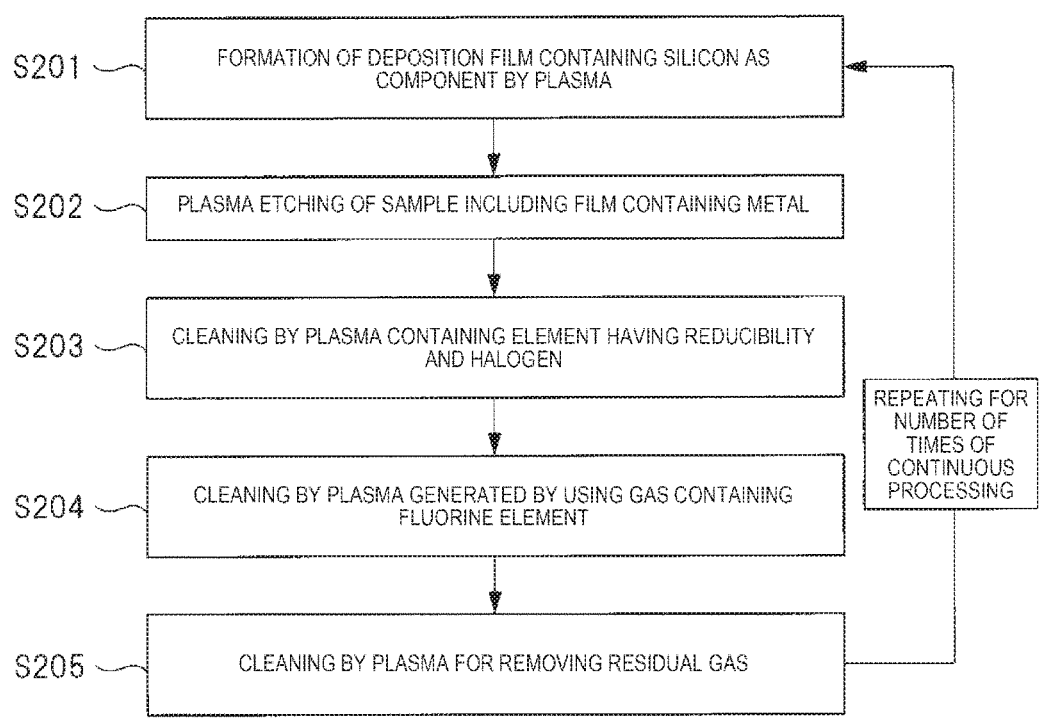
FIG. 2 is a flowchart illustrating an example of a procedure of a plasma processing method using the plasma processing apparatus illustrated in FIG. 1.
Figure 3:
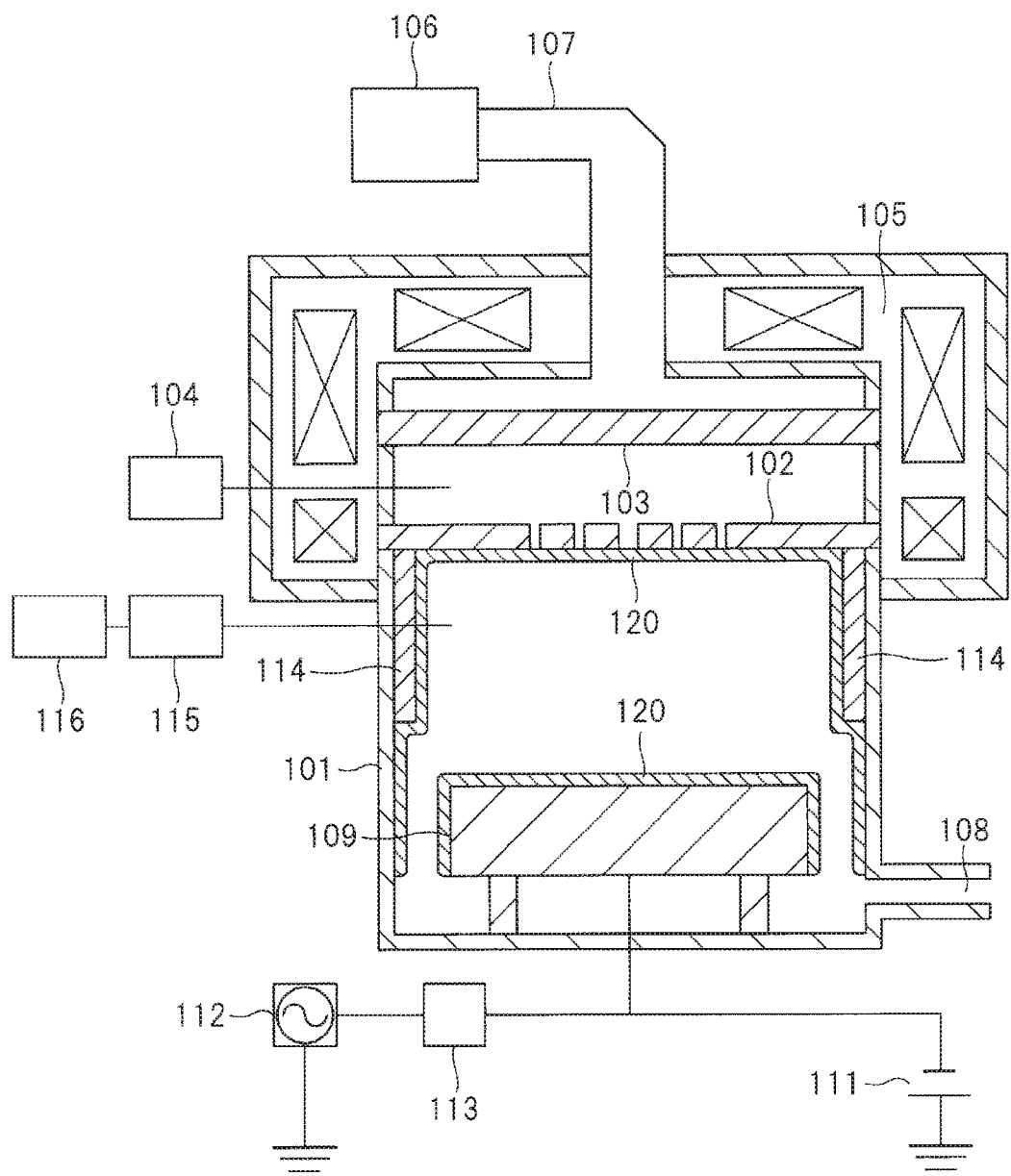
FIG. 3 is a sectional view illustrating an example of a state where a deposition film is formed on an inner wall of a chamber in the plasma processing apparatus illustrated in FIG. 1.

Next, a plasma processing method using the plasma processing apparatus of Embodiment 1 will be described. FIG. 2 is a flowchart illustrating an example of a procedure of the plasma processing method using the plasma processing apparatus illustrated in FIG. 1, and FIG. 3 is a sectional view illustrating an example of a state where a deposition film is formed on the inner wall of the chamber in the plasma processing apparatus illustrated in FIG. 1.

The plasma processing method according to Embodiment 1 is configured of five elements (steps) of (1) to (5) illustrated below and is processed in accordance with the procedure illustrated in FIG. 2. That is, (1) forming of a deposition film containing silicon as a component by using plasma, (2) plasma etching of the sample having the film containing a metal, and (3) cleaning by an element having reducibility and plasma containing halogen. Furthermore, (4) cleaning by plasma mainly composed of fluorine and (5) cleaning by plasma for removing residual gas.

Hereinafter, each configuration element will be described based on the plasma processing method of Embodiment 1 illustrated in FIG. 2. First, as illustrated in FIG. 3, a deposition film 120 composed of silicon (Si) as a component is formed by using a first plasma generated inside the processing chamber 101 (S201, a deposition film forming step). Here, the deposition film 120 composed of silicon as a component is formed each of a part of the inner wall (chamber inner wall) of the processing chamber 101 and a part of the sample table 109 by the first plasma. That is, the deposition film 120 is mainly formed at a position near the same height as that of the sample table 109 of the inner wall of the processing chamber 101 and a position higher than the sample table 109. Furthermore, the deposition film 120 is also formed on the upper surface and the side surface of the sample table 109. Therefore, a part of the inner wall of the processing chamber 101 and a part of the sample table 109 are in a state of being covered by the deposition film 120.

An example of forming the deposition film 120 containing silicon as a component is a film containing silicon and carbon formed by a mixed gas of gas containing silicon and gas containing carbon (C). Otherwise, the example is a film containing silicon and nitrogen formed by a mixed gas of gas containing silicon and gas containing nitrogen (N). Furthermore, the example is a film containing silicon and oxygen formed by a mixed gas of gas containing silicon and gas containing oxygen (O). In the embodiment, a case where a film containing silicon oxide as a component by a mixed gas of silicon tetrachloride gas and oxygen gas is formed will be described.

Next, the sample 110 that is plasma-etched is inserted into the processing chamber 101 and disposed on the sample table 109 that is the substrate electrode, and then the sample 110 on which a film containing a metal is formed is plasma-etched (S202, a plasma processing step). After completion of the plasma etching, the sample 110 is carried out of the processing chamber 101. The sample 110 on which the film containing the metal is formed is plasma-etched and thereby a metal-based reaction product and a non-metal-based reaction product are generated. Apart of each of the metal-based reaction product and the non-metal-based reaction product is deposited on the deposition film 120 formed inside the processing chamber 101.

After etching, the metal-based reaction product (deposit containing a metal element) remaining on the deposition film 120 is removed by using a second plasma containing an element having reducibility and halogen (S203, a metal removing step). That is, the second plasma containing the element having reducibility and halogen is generated and the metal-based reaction product generated in (S202) step is removed by using the second plasma. The metal-based reaction product is deposited in an oxidized or fluorinated state, and it is difficult to sufficiently remove the metal-based reaction product with plasma generated by a halogen single gas.

Therefore, in Embodiment 1, the second plasma is generated by using a mixed gas obtained by adding gas containing an element having reducibility such as silicon, boron, nitrogen, hydrogen, or carbon, to halogen gas, and the metal-based reaction product is removed by the second plasma. In Embodiment 1, as an example, a case where cleaning is performed by using the second plasma generated by using a mixed gas of boron trichloride gas and chlorine gas will be described. The metal-based reaction product can be removed by the plasma processing using boron trichloride gas.

Next, the deposition film 120 containing silicon as a component and the metal-based reaction product deposited on the deposition film 120 are removed by a third plasma generated by using gas containing fluorine element (S204, a deposition film removing step). That is, the deposition film 120 formed inside the processing chamber 101 is removed in (S202) step by the third plasma generated by using gas containing the fluorine. That is, the metal-based reaction product is a reaction product generated when the sample 110 on which a film containing a metal is formed is etched in (S202) step.

The third plasma can be generated by using gas (for example, nitrogen trifluoride gas, sulfur hexafluoride gas, or the like) containing the fluorine element. If the plasma processing containing the fluorine element is executed, a configuration element of gas containing the fluorine element remains in the processing chamber 101. In Embodiment 1, as an example of gas containing the fluorine element, a case where nitrogen trifluoride gas is used will be described. In a case where nitrogen trifluoride gas is used, nitrogen and fluorine remain in the processing chamber 101.

A fourth plasma is generated and residual elements such as nitrogen and fluorine remaining in the processing chamber 101 are removed by using the fourth plasma (S205, a fluorine element removing step). The fourth plasma can be generated by using a rare gas (helium gas (He), neon gas (Ne), argon gas (Ar), krypton gas (Kr), or xenon gas (Xe)), oxygen gas, and the like. These kinds of gas can be expected to have an effect of removing an element remaining on a wall surface (chamber inner wall) of the processing chamber 101 by ion sputtering generated when plasma is generated.

Figure 4:
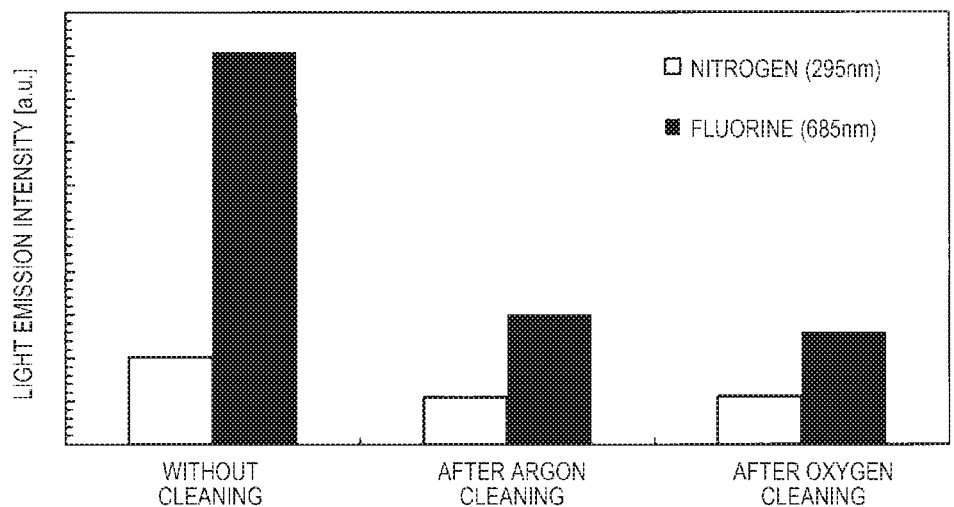
FIG. 4 is a graph illustrating an example of a removing effect of nitrogen and fluorine in the plasma processing method of Embodiment 1 of the invention.

Here, FIG. 4 is a block diagram illustrating an example of a removing effect of nitrogen and fluorine in the plasma processing method of Embodiment 1 of the invention. Specifically, in (S205) step, the removing effect of the residual nitrogen and the residual fluorine by the fourth plasma is illustrated and time average light emission intensities of nitrogen and fluorine in the argon discharge in the following three cases are illustrated, respectively. Specifically, there are a case (without cleaning) where the argon discharge (discharge for detecting plasma light emission) is executed after cleaning using nitrogen trifluoride gas and a case (argon cleaning) where cleaning is executed by using argon gas and the argon discharge (discharge for detecting the plasma light emission) is executed after cleaning using nitrogen trifluoride gas. Furthermore, there is a case (oxygen cleaning) where cleaning is executed using oxygen gas and the argon discharge (discharge for detecting the plasma light emission) is executed after cleaning using nitrogen trifluoride gas. In these three cases, the time average light emission intensities of nitrogen and fluorine during the argon discharge are illustrated and as illustrated in FIG. 4, it can be seen that residual nitrogen amount and fluorine amount can be reduced by performing argon or oxygen cleaning.

Figure 5:
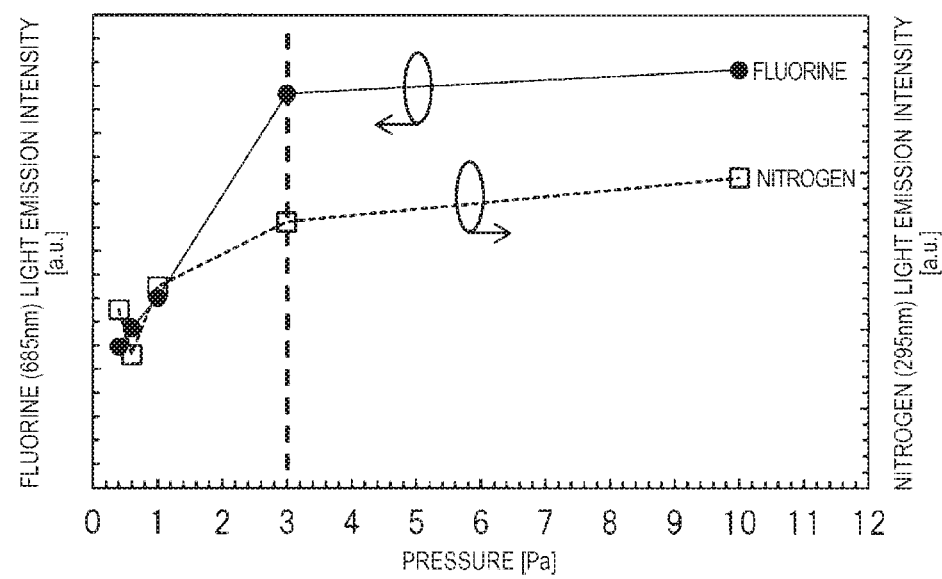
FIG. 5 is a graph illustrating an example of dependency of a plasma processing pressure according to Embodiment 1 of the invention.

In addition, FIG. 5 is a graph illustrating an example of dependency of a plasma processing pressure according to Embodiment 1 of the invention. Specifically, a result of pressure dependency of oxygen plasma with respect to the cleaning effect of residual nitrogen and fluorine evaluated by the same evaluation method as the result illustrated in FIG. 4 is illustrated. As illustrated in FIG. 5, the light emission intensities of nitrogen and fluorine during the argon discharge are further reduced by setting a processing pressure of oxygen plasma to be generated to 3 Pa or less. That is, it is possible to improve the effect by the plasma cleaning by setting a pressure condition of oxygen plasma to be generated to 3 Pa or less. This is thought because plasma is diffused into the processing chamber 101 due to a low pressure. That is, in (S205) step, the processing pressure of cleaning by using the fourth plasma is desirably greater than or equal to 0.01 Pa and less than or equal to 3 Pa and in (S204) step, and which is desirably smaller (lower) than the processing pressure of cleaning by using the third plasma. That is, the pressure for generating the fourth plasma of the fluorine element removing step is desirably smaller than the pressure for generating the third plasma of the deposition film removing step.

In addition, in (S204) step, cleaning by the third plasma using nitrogen trifluoride gas is executed and then in (S205) step, cleaning by the fourth plasma generated by using sulfur hexafluoride gas is executed. Furthermore, it is possible to reduce a removing time of residual nitrogen and residual fluorine by executing cleaning using oxygen gas executed as the fourth plasma.

Figure 6:
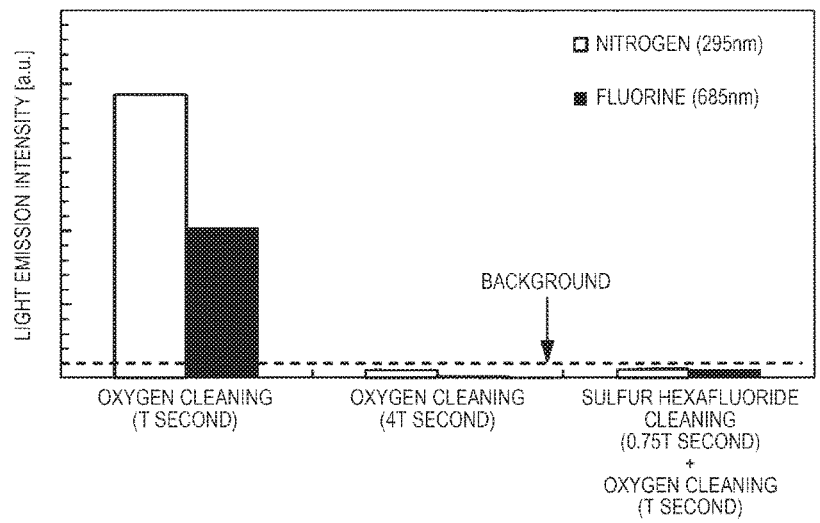
FIG. 6 is a graph illustrating an example of a removing effect of nitrogen and fluorine by plasma processing according to Embodiment 1 of the invention.

In addition, FIG. 6 is a graph illustrating an example of the removing effect of nitrogen and fluorine by plasma processing according to Embodiment 1 of the invention, and illustrates the time average light emission intensities of nitrogen and fluorine during argon discharge in the following three cases.

Specifically, FIG. 6 illustrates the time average light emission intensities of nitrogen and fluorine during the argon discharge in each of a case where the argon discharge (discharge for detecting plasma light emission) is executed by executing cleaning using oxygen for T seconds, a case where the argon discharge (discharge for detecting plasma light emission) is executed by executing cleaning using oxygen for 4 T seconds, and a case where the argon discharge (discharge for detecting plasma light emission) is executed by executing cleaning using sulfur hexafluoride for 0.75 T seconds and executing cleaning using oxygen for T seconds. Moreover, a broken line in FIG. 6 indicates a numerical value of a background and if the numerical value is less than or equal to the broken line, it can be judged that the light emission intensities of nitrogen and fluorine are sufficiently lowered during the argon discharge.

As illustrated in FIG. 6, it can be seen that the light emission intensities of residual nitrogen and fluorine by the plasma processing using nitrogen trifluoride gas are sufficiently lowered by executing cleaning by oxygen for 4 T seconds. On the other hand, it can be seen that the light emission intensity is sufficiently lowered for 1.75 T seconds by executing oxygen cleaning after the plasma processing generated by sulfur hexafluoride. In an experiment, 56.25% processing time can be shortened by inserting cleaning using sulfur hexafluoride before oxygen cleaning. In addition, it is preferable that a time of plasma cleaning using oxygen gas is longer than a time of plasma cleaning using sulfur hexafluoride gas.

Moreover, as illustrated in FIG. 2, a series of plasma processing from (S201) to (S205) is repeatedly executed for each plasma processing the sample 110. That is, a series of plasma processing from (S201) to (S205) is repeated for the number of times of continuous processing of the sample 110.

According to the plasma processing apparatus and the plasma processing method of Embodiment 1, it is possible to remove the residue caused by plasma cleaning, stabilize the state of the chamber inner wall to stabilize an atmosphere in the processing chamber 101. Therefore, it is possible to suppress process fluctuation in plasma etching.

That is, it is possible to stabilize the state of the inner wall (chamber inner wall) of the processing chamber 101 by removing the deposition film 120 in the processing chamber 101 with gas containing the fluorine element and then removing gas (residual gas) containing the fluorine element in the processing chamber 101. Therefore, it is possible to suppress fluctuation (process fluctuation) of the atmosphere the inside (inside of the chamber) of the processing chamber 101 and, as a result, it is possible to improve mass production stability performance in semiconductor manufacturing.

Further specifically, in the metal etching step, it is possible to prevent accumulation of the metal-based reaction product in the processing chamber 101. In addition, it is possible to effectively remove the residues such as fluorine and nitrogen in the plasma processing and to stabilize the state of the inner wall (chamber inner wall) of the processing chamber 101. Therefore, it is possible to suppress the fluctuation of the atmosphere inside (inside of the chamber) the processing chamber 101. As a result, it is possible to improve the mass production stability performance in semiconductor manufacturing.

In addition, it is possible to remove the metal-based reaction product deposited on the deposition film 120 in the processing chamber 101 by plasma etching the sample 110 and then plasma cleaning the inside of the processing chamber 101 by the second plasma generated by using the mixed gas of boron trichloride gas and chlorine gas.

In addition, when the deposition film 120 in the processing chamber 101 is removed by cleaning by the third plasma using gas containing the fluorine element and then the residual gas remaining in the processing chamber 101 is removed by using the fourth plasma (fluorine element removing step), it is possible to remove at least the fluorine element (residual gas) remaining in the processing chamber 101 by using the rare gas such as helium gas, neon gas, argon gas, krypton gas, or xenon gas, and oxygen gas for generating the fourth plasma. It is possible to improve a clean effect in the processing chamber 101.

In addition, it is possible to reduce the residual nitrogen amount and the fluorine amount by executing cleaning using argon gas (argon cleaning) after cleaning using nitrogen trifluoride gas or executing cleaning using the oxygen gas (oxygen cleaning) after cleaning using nitrogen trifluoride gas as processing by the fourth plasma.

In addition, in the cleaning by the fourth plasma, a processing pressure of the processing chamber 101 is greater than or equal to 0.01 Pa and less than or equal to 3 Pa. Therefore, it is possible to diffuse the fourth plasma in the processing chamber 101 by a low pressure and to improve the effect by the plasma cleaning.

In addition, cleaning of removing the deposition film 120 in the processing chamber 101 is executed by the third plasma using nitrogen trifluoride gas and then the cleaning is executed by the fourth plasma generated by using sulfur hexafluoride gas. In this case, the plasma cleaning is performed by sulfur hexafluoride gas and then the plasma cleaning is executed by using oxygen gas. Therefore, it is possible to reduce the removing time of residual nitrogen and residual fluorine in the processing chamber 101.

Moreover, before the plasma cleaning is executed by using oxygen gas, the plasma cleaning is executed by using sulfur hexafluoride. Therefore, it is possible to greatly reduce the processing time of the cleaning.

Embodiment 2

Figure 7:
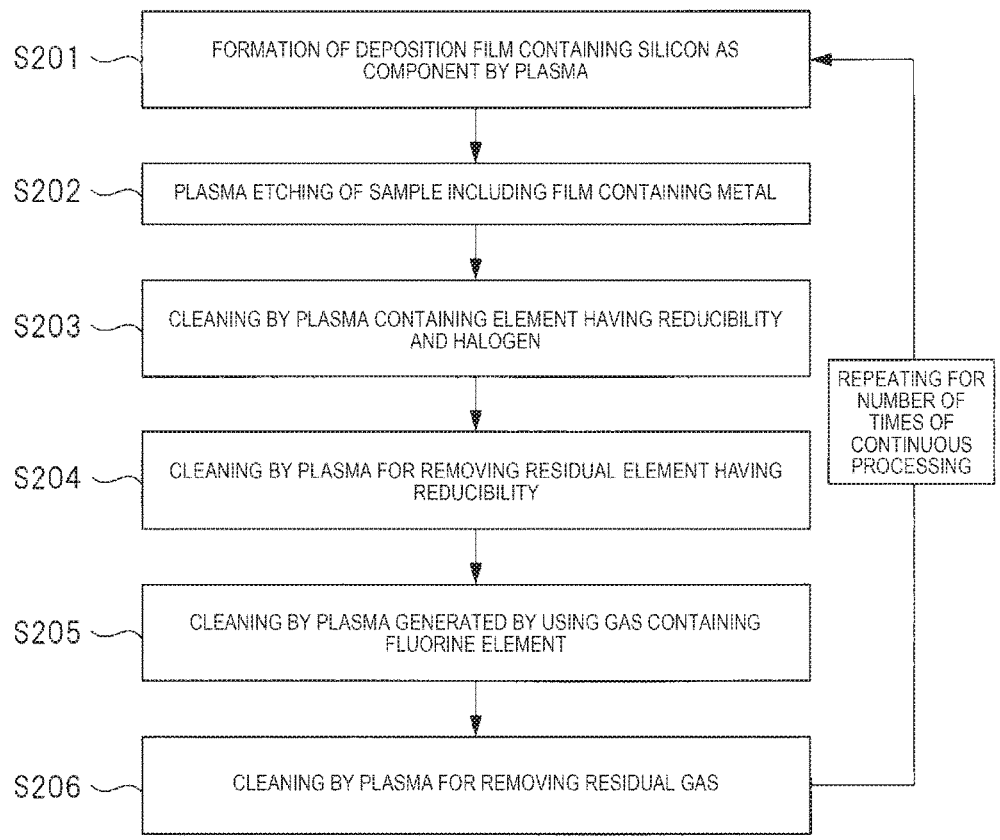
FIG. 7 is a flowchart illustrating an example of a procedure of a plasma processing method according to Embodiment 2 of the invention.

FIG. 7 is a flowchart illustrating an example of a procedure of a plasma processing method according to Embodiment 2 of the invention.

Since a plasma processing apparatus of Embodiment 2 is the same as the plasma processing apparatus illustrated in FIG. 1 described in Embodiment 1, duplicate description of the structure thereof will be omitted.

Next, the plasma processing method of Embodiment 2 will be described with reference to FIG. 7.

The plasma processing method according to Embodiment 2 is configured of six elements (steps) of (1) to (6) illustrated below and is processed in accordance with the procedure illustrated in FIG. 7. That is, (1) forming of a deposition film containing silicon as a component by using plasma, (2) plasma etching of a sample having a film containing a metal, and (3) cleaning by an element having reducibility and plasma containing halogen. Furthermore, (4) cleaning by plasma for removing residual element having reducibility, (5) cleaning by plasma mainly composed of fluorine, and (6) cleaning by plasma for removing residual gas.

Hereinafter, each configuration element will be described based on the plasma processing method of Embodiment 2 illustrated in FIG. 7. Similar to Embodiment 1, first, as illustrated in FIG. 3, a deposition film 120 composed of silicon (Si) as a component is formed by using a first plasma generated inside the processing chamber 101 (S201, a deposition film forming step). Here, the deposition film 120 composed of silicon as a component is formed each of a part of the inner wall (chamber inner wall) of the processing chamber 101 and a part of the sample table 109 by the first plasma. That is, the deposition film 120 is mainly formed at a position near the same height as that of the sample table 109 of the inner wall of the processing chamber 101 and a position higher than the sample table 109. Furthermore, the deposition film 120 is also formed on the upper surface and the side surface of the sample table 109. Therefore, a part of the inner wall of the processing chamber 101 and a part of the sample table 109 are in a state of being covered by the deposition film 120.

An example of forming the deposition film 120 containing silicon as a component is a film containing silicon and carbon formed by a mixed gas of gas containing silicon and gas containing carbon (C). Otherwise, the example is a film containing silicon and nitrogen formed by a mixed gas of gas containing silicon and gas containing nitrogen (N). Furthermore, the example is a film containing silicon and oxygen formed by a mixed gas of gas containing silicon and gas containing oxygen (O). In the embodiment, a case where a film containing silicon oxide as a component by a mixed gas of silicon tetrachloride gas and oxygen gas is formed will be described.

Next, the sample 110 that is plasma-etched is inserted into the processing chamber 101 and disposed on the sample table 109 that is the substrate electrode, and then the sample 110 on which a film containing a metal is formed is plasma-etched (S202, a plasma processing step). After completion of the plasma etching, the sample 110 is carried out of the processing chamber 101. The sample 110 on which the film containing the metal is formed is plasma-etched and thereby a metal-based reaction product and a non-metal-based reaction product are generated. Apart of each of the metal-based reaction product and the non-metal-based reaction product is deposited on the deposition film 120 formed inside the processing chamber 101.

After etching, the metal-based reaction product (deposit containing a metal element) remaining on the deposition film 120 is removed by using a second plasma containing an element having reducibility and halogen (S203, a metal removing step). That is, the second plasma containing the element having reducibility and halogen is generated and the metal-based reaction product generated in (S202) step is removed by using the second plasma. The metal-based reaction product is deposited in an oxidized or fluorinated state, and it is difficult to sufficiently remove the metal-based reaction product with plasma generated by a halogen single gas.

Therefore, also in Embodiment 2, the second plasma is generated by using a mixed gas obtained by adding gas containing an element having reducibility such as silicon, boron, nitrogen, hydrogen, or carbon, to halogen gas, and the metal-based reaction product is removed by the second plasma. Also in Embodiment 2, as an example, a case where cleaning is performed by using the second plasma generated by using a mixed gas of boron trichloride gas and chlorine gas will be described. The metal-based reaction product can be removed by the plasma processing using boron trichloride gas. On the other hand, it can be seen that boron is deposited on the wall surface (inner wall) of the processing chamber 101 by an experiment.

Residual boron is removed by using a fifth plasma for removing the residual element having reducibility (S204, a reductive element removing step). That is, an element remaining in the processing chamber 101 and having reducibility is removed by using the fifth plasma. In Embodiment 2, a case where cleaning is performed by plasma generated using chlorine gas by removing residual boron will be described.

Figure 8:
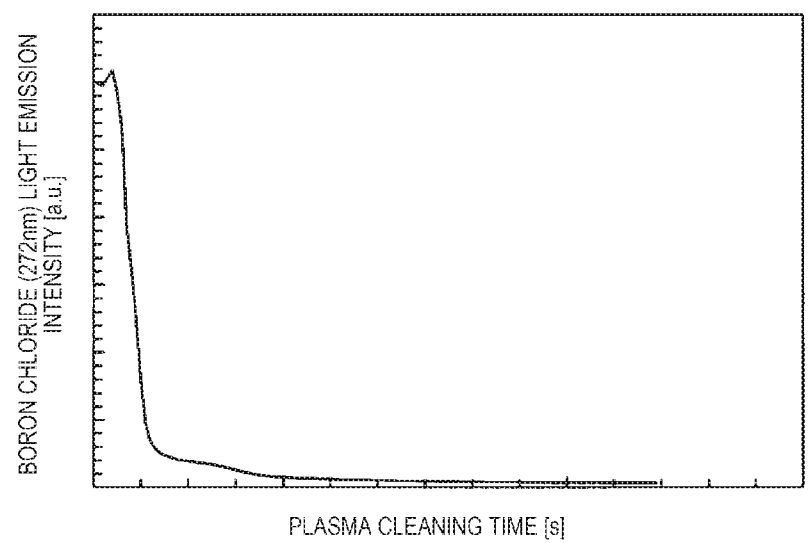
FIG. 8 is a graph illustrating a removing effect of boron in the plasma processing method of Embodiment 2 of the invention.

FIG. 8 is a graph illustrating a removing effect of boron in the plasma processing method of Embodiment 2 of the invention. Specifically, FIG. 8 illustrates a change over time in a light emission intensity of boron chloride in the processing chamber 101 during cleaning when boron is removed by the fifth plasma generated by using chlorine gas. Boron remaining in the processing chamber 101 is exhausted to the outside of the processing chamber 101 as boron chloride by chlorine plasma. As illustrated in FIG. 8, it can be seen that the light emission intensity of boron chloride is lowered and an amount of residual boron is decreased in the processing chamber 101 as a plasma cleaning time is increased.

Next, the deposition film 120 containing silicon as a component and the metal-based reaction product deposited on the deposition film 120 are removed by a third plasma generated by using gas containing fluorine element (S205, a deposition film removing step). That is, the deposition film 120 formed inside the processing chamber 101 is removed in (S202) step by the third plasma generated by using gas containing the fluorine. That is, the metal-based reaction product is a reaction product generated when the sample 110 on which a film containing a metal is formed is etched in (S202) step.

The third plasma can be generated by using gas (for example, nitrogen trifluoride gas, sulfur hexafluoride gas, or the like) containing the fluorine element. If the plasma processing containing the fluorine element is executed, a configuration element of gas containing the fluorine element remains in the processing chamber 101. Also in Embodiment 2, as an example of gas containing the fluorine element, a case where nitrogen trifluoride gas is used will be described. In a case where nitrogen trifluoride gas is used, nitrogen and fluorine remain in the processing chamber 101.

A fourth plasma is generated and residual elements such as nitrogen and fluorine remaining in the processing chamber 101 are removed by using the fourth plasma (S206, a fluorine element removing step). The fourth plasma can be generated by using a rare gas (helium gas (He), neon gas (Ne), argon gas (Ar), krypton gas (Kr), or xenon gas (Xe)), oxygen gas, and the like. These kinds of gas can be expected to have an effect of removing an element remaining on a wall surface (chamber inner wall) of the processing chamber 101 by ion sputtering generated when plasma is generated.

Specifically, in (S206) step, the removing effect of the residual nitrogen and the residual fluorine by the fourth plasma is illustrated and time average light emission intensities of nitrogen and fluorine in the argon discharge in the following three cases are illustrated, respectively. Specifically, there are a case (without cleaning) where the argon discharge (discharge for detecting plasma light emission) is executed after cleaning using nitrogen trifluoride gas and a case (argon cleaning) where cleaning is executed by using argon gas and the argon discharge (discharge for detecting the plasma light emission) is executed after cleaning using nitrogen trifluoride gas. Furthermore, there is a case (oxygen cleaning) where cleaning is executed using oxygen gas and the argon discharge (discharge for detecting the plasma light emission) is executed after cleaning using nitrogen trifluoride gas. In these three cases, the time average light emission intensities of nitrogen and fluorine during the argon discharge are illustrated and as illustrated in FIG. 4, it can be seen that residual nitrogen amount and fluorine amount can be reduced by performing argon or oxygen cleaning.

As illustrated in FIG. 5, the light emission intensities of nitrogen and fluorine during the argon discharge are further reduced by setting a processing pressure of oxygen plasma to be generated to 3 Pa or less. That is, it is possible to improve the effect by the plasma cleaning by setting a pressure condition of oxygen plasma to be generated to 3 Pa or less. This is thought because plasma is diffused into the processing chamber 101 due to a low pressure. That is, in (S206) step, the processing pressure of cleaning by using the fourth plasma is desirably greater than or equal to 0.01 Pa and less than or equal to 3 Pa and in (S205) step, and the processing pressure is desirably smaller (lower) than the processing pressure of cleaning by using the third plasma. That is, the pressure for generating the fourth plasma of the fluorine element removing step is desirably smaller than the pressure for generating the third plasma of the deposition film removing step.

In addition, in (S205) step, cleaning by the third plasma using nitrogen trifluoride gas is executed and then in (S206) step, cleaning by the fourth plasma generated by using sulfur hexafluoride gas is executed. Furthermore, it is possible to reduce a removing time of residual nitrogen and residual fluorine by executing cleaning using oxygen gas executed as the fourth plasma.

In addition, FIG. 6 illustrates the time average light emission intensities of nitrogen and fluorine during argon discharge in each of a case where cleaning using oxygen is executed for T seconds and the argon discharge (discharge for detecting plasma light emission) is executed, a case where cleaning using oxygen is executed for 4 T seconds and the argon discharge (discharge for detecting plasma light emission) is executed, and a case where cleaning using sulfur hexafluoride is executed for 0.75 T seconds, cleaning using oxygen is executed for T seconds, and the argon discharge (discharge for detecting plasma light emission) is executed. Moreover, a broken line in FIG. 6 indicates a numerical value of a background and if the numerical value is less than or equal to the broken line, it can be judged that the light emission intensities of nitrogen and fluorine are sufficiently lowered during the argon discharge.

As illustrated in FIG. 6, it can be seen that the light emission intensities of residual nitrogen and fluorine by the plasma processing using nitrogen trifluoride gas are sufficiently lowered by executing cleaning by oxygen for 4 T seconds. On the other hand, it can be seen that the light emission intensity is sufficiently lowered for 1.75 T seconds by executing oxygen cleaning after the plasma processing generated by sulfur hexafluoride. In an experiment, 56.25% processing time can be shortened by inserting cleaning using sulfur hexafluoride before oxygen cleaning. In addition, it is preferable that a time of plasma cleaning using oxygen gas is longer than a time of plasma cleaning using sulfur hexafluoride gas.

Moreover, as illustrated in FIG. 7, a series of plasma processing from (S201) to (S206) is repeatedly executed for each plasma processing the sample 110. That is, a series of plasma processing from (S201) to (S206) is repeated for the number of times of continuous processing of the sample 110.

According to the plasma processing method of Embodiment 2, it is possible to remove the residue element having reducibility by executing cleaning by plasma for removing the residual element having reducibility after executing cleaning by plasma containing the element having reducibility and halogen and before executing cleaning by plasma containing fluorine as a main component.

Specifically, it is possible to remove the reductive element attached to the wall surface of the processing chamber 101 such as silicon and boron.

Since the other effects obtained by the plasma processing method of Embodiment 2 are the same as those of the plasma processing method of Embodiment 1, duplicate description thereof will be omitted.

Although the invention made by the present inventors is concretely described based on the embodiments above, the invention is not limited to the above-described embodiments, but includes various modified examples. For example, the above-described embodiments are described in detail in order to explain the invention in an easy-to-understand manner, and are not necessarily limited to those having all the configurations described.

In addition, it is possible to replace a part of the configuration of one embodiment with the configuration of another embodiment, and it is also possible to add the configuration of another embodiment to the configuration of one embodiment. Further, it is possible to add, delete, and replace other configurations with respect to part of the configuration of each embodiment. Each member and the relative size described in the drawings are simplified and idealized for easy understanding of the present invention, and they are more complicated in terms of mounting.

The structures and methods described in Embodiments 1 and 2 are not limited to those in Embodiments 1 and 2, and various application examples are included. For example, in Embodiment 1 and 2, as an example of the plasma processing apparatus, the electron cyclotron resonance plasma etching apparatus (ECR) is detects, but it is possible to obtain the same effects even in a plasma processing apparatus of an Inductively Coupled Plasma (ICP), a Capacitively Coupled Plasma (CCP), or the like.

What is claimed is:

1. A plasma processing method comprising:
   forming a deposition film containing silicon as a component in a processing chamber by using plasma generated in the processing chamber in which plasma processing is performed on a sample having a film containing a metal;
   plasma processing the sample after the forming of the deposition film;
   removing a deposit containing a metal element in the processing chamber by using plasma after the plasma processing;
   removing the deposition film in the processing chamber by plasma generated by using gas containing a fluorine element after the removing of the deposit containing a metal element; and
   removing the fluorine element remaining in the processing chamber by using plasma after the removing of the deposition film.

2. The plasma processing method according to claim 1, wherein plasma in the removing of the fluorine element is generated by using oxygen gas.

3. The plasma processing method according to claim 1, wherein a pressure for generating plasma in the removing of the fluorine element is smaller than a pressure for generating plasma in the removing of the deposition film.

4. The plasma processing method according to claim 1, further comprising:
   removing an element having reducibility and remaining in the processing chamber by using plasma after the removing of the deposit containing a metal element.

5. The plasma processing method according to claim 4, wherein plasma in the removing of the element having reducibility is generated by using chlorine gas.

6. The plasma processing method according to claim 4, wherein the element having reducibility is silicon, boron, nitrogen, hydrogen, or carbon.

7. The plasma processing method according to claim 1, wherein plasma in the removing of the fluorine element is generated by using helium gas, neon gas, argon gas, krypton gas, or xenon gas.

8. The plasma processing method according to claim 4, wherein plasma in the forming of the deposition film is generated by using mixed gas of silicon tetrachloride gas and oxygen gas,
   wherein plasma in the removing of the deposit containing a metal element is generated by using mixed gas of boron trichloride gas and chlorine gas,
   wherein plasma in the removing of the element having reducibility is generated by using chlorine gas, and
   wherein plasma in the removing of the deposition film is generated by using nitrogen trifluoride gas.

* * * * *